(12) United States Patent  (10) Patent No.: US 8,564,762 B2
Kim et al.  (45) Date of Patent: Oct. 22, 2013

(54) PHOTOLITHOGRAPHY EXPOSURE APPARATUS HAVING BLINDING PLATES AND METHOD OF DRIVING THE SAME

(75) Inventors: Chang-Hoon Kim, Asan-si (KR); Bo-Kyoung Ahn, Cheonan-si (KR); Hong-Suk Yoo, Anyang-si (KR)

(73) Assignee: Samsung Display Co., Ltd. (KR)

( * ) Notice: Subject to any disclaimer, the term of this patent is extended or adjusted under 35 U.S.C. 154(b) by 276 days.

(21) Appl. No.: 13/086,293

(22) Filed: Apr. 13, 2011

(65) Prior Publication Data

US 2012/0086930 A1  Apr. 12, 2012

(30) Foreign Application Priority Data

Oct. 8, 2010 (KR) .......... 10-2010-0098248

(51) Int. Cl.
*G02B 26/02* (2006.01)
*G03B 27/32* (2006.01)
*G03B 27/42* (2006.01)
*G03B 27/54* (2006.01)
*G03B 27/72* (2006.01)

(52) U.S. Cl.
USPC .......... 355/71; 355/53; 355/67; 355/77; 359/227

(58) Field of Classification Search
CPC .......... G03F 7/70275; G03F 7/7055
USPC .......... 355/53, 67, 71, 77; 359/227; 430/5
See application file for complete search history.

(56) References Cited

U.S. PATENT DOCUMENTS

2002/0190189 A1* 12/2002 Tanimoto .......... 250/208.1

* cited by examiner

*Primary Examiner* — Toan Ton
*Assistant Examiner* — Colin Kreutzer
(74) *Attorney, Agent, or Firm* — Innovation Counsel LLP

(57) ABSTRACT

An exposure apparatus includes a light source for providing bursts of photolithographic exposure light, a mask for applying a pattern to the photolithographic exposure light, a variable length blind for blocking parts of an exposure window from receiving the photolithographic exposure light and a blind driver for controllably driving the variable length blind. The blind includes a plurality of movable blocking plates. The blind driver includes a plurality of motors and a motor control unit which are structured to rapidly return one or more of the blocking plates through the exposure window in a time duration between the bursts of photolithographic exposure light so that a return stain is not formed on the substrate. In one embodiment, the substrate is a mother substrate having a plurality of LCD daughter substrates being formed thereon.

20 Claims, 10 Drawing Sheets

PHOTOLITHOGRAPHY EXPOSURE APPARATUS HAVING BLINDING PLATES AND METHOD OF DRIVING THE SAME

PRIORITY STATEMENT

This application claims priority under 35 U.S.C. §119 to Korean Patent Application No. 2010-0098248, filed on Oct. 8, 2010 in the Korean Intellectual Property Office (KIPO), the contents of which application are herein incorporated by reference in their entirety.

BACKGROUND

1. Field of Disclosure

The present disclosure of invention relates to a photolithography exposure apparatus having a variable length exposure blind and a method of operating the exposure apparatus. More particularly, the present disclosure relates to an exposure apparatus having a variable length exposure blind as used for providing photolithographic exposure to a fed-through mother substrate where the method of operation is capable of preventing formation of a shadow stain on the substrate resulting from moving of the variable length blind whereby elimination of the stain can improve quality of Liquid Crystal Display (LCD) substrates or other substrates whose monolithically integrated structures are formed by the exposure apparatus.

2. Description of Related Technology

Generally, a liquid crystal display (LCD) apparatus includes an LCD panel having two monolithically integrated substrates, namely, a thin film transistors (TFTs) containing substrate, and a color filters containing substrate. The two substrates are disposed opposite to and spaced apart from each other. A liquid crystal material layer is interposed between the TFTs substrate and the color filters substrate.

The TFTs substrate and the color filters substrate generally each has a multi-layered and monolithically integrated structure that is formed by use of one or more of a photolithography mask creating step, an exposure step that utilizes the photomask and an etching or other pattern development step that converts the photolithographically created image pattern into a structural pattern on the in-process substrate.

In the exposure step, light is irradiated onto a substrate, upon which for example, a light sensitive photoresist (PR) layer is coated, where the irradiated light first passes through a photomask having a specific imaging pattern. The photoresist layer is caused to chemically change (react) in accordance with the mask-passed light and to thus form a developed pattern thereon according to an exposure pattern formed on the photomask.

To decrease a cost for manufacturing each individual liquid crystal display apparatus, many LCD panels (daughter panels) are often simultaneously formed on a single mother substrate. However, the size of mother substrates tends to increase over time so that more liquid crystal display panels may be economically formed in one manufacturing process. However, with increase of the size of the mother substrate, a size of the corresponding photomask may be also increased such that the cost for manufacturing the liquid crystal display apparatus may be increased due to need to create photomasks of ever increasing sizes.

Recently, it has been proposed that a relatively small photomask be employed for a much larger mother substrate during the exposure process in order to avoid need for gargantuan mother-sized photomasks. In the proposed small mask type exposure process, the mother substrate is exposed using a plurality of sequential exposures to one or more small-sized photomasks, where the photomask(s) is/are moved about in between the exposures to thus expose different areas of the larger mother substrate. In an alternate embodiment, the mother substrate is moved relative to the photomask(s). In yet another alternate embodiment, both of the mother substrate and the photomask(s) are moved relative to each other.

Thus during any given exposure step, the mother substrate has an exposed area which is exposed to a given photomask and a non-exposed area that is not exposed to that given photomask. The photolithography exposure apparatus includes a movable light-blocking blind that for example blocks exposure of a second half of a corresponding window area of the substrate to thus prevent the blind-covered second area from being exposed while a first area is exposed to a half-sized photomask. Then the blind is moved from the second side of the exposure window to the first side of the exposure window to thus unblock the previously blocked second area while covering up the already exposed first area. After both halves of the mother substrate have been exposed to the pattern of the half-sized photomask, the blind is returned from the second side back to the first side of the exposure window in preparation for processing a next supplied, mother substrate or portion of the mother substrate.

However, in the so-proposed photolithography exposure apparatus, the exposure light is kept turned on all the time and when the blind is returned from the second area to the first (or alternatively, the mother substrate is translated into its second half exposure state), some sub-areas of the mother substrate are temporarily exposed more so to the irradiating light than are others and accordingly, a shadow stain may be shown in the overall exposed area of the mother substrate due to different amounts of exposure.

When the stain is relatively serious, the display quality of a liquid crystal display panel produced from the so-processed mother substrate may be deteriorated. Even if the stain is not relatively serious, the stain may be a noise factor that impedes detecting of other display errors. Thus, the display quality may be deteriorated.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides an exposure apparatus including a variable length blind having one or more moveable plates that can be returned at relatively high speeds through the area of an exposure window and in between flashings of a flashed irradiating source (e.g., a laser source) to thus prevent a shadow stain from appearing on the photolithographically developed substrate due to movement of the variable length blind.

The present disclosure also provides a method for operating the exposure apparatus.

An example exposure apparatus in accordance with the disclosure includes a light source, a mask retaining part, a variable length blind and a blind driver. The light source emits a photolithography exposure light in flashes and in accordance with a predetermined light emitting cycle. The blind driver is operated so as to quickly translate plates of the variable length blind completely through an exposure window area of the apparatus in a time less than the time between the flashes of the light source. To do so, the blind driver is coupled to and synchronized to a flash invoking part of the flashed light source. Additionally, in one embodiment, movable plates of the variable length blind are accelerated along an acceleration track that leads towards entry into the exposure window so that the plates can be moving at a velocity sufficient to completely be clear of the exposure window in a time equal to or less than the period of the flash invoking part of the flashed light source. In this way the plates are moved through the exposure window area without creating a shadowing stain on the being exposed mother substrate.

Other aspects of the present teachings will become apparent from the below detailed description.

BRIEF DESCRIPTION OF THE DRAWINGS

The above and other features and advantages of the present disclosure of invention will become more apparent by describing in detailed example embodiments thereof with reference to the accompanying drawings, in which.

DETAILED DESCRIPTION

Hereinafter, the present disclosure of invention will be provided in more detail with reference to the accompanying drawings.

Figure 1:
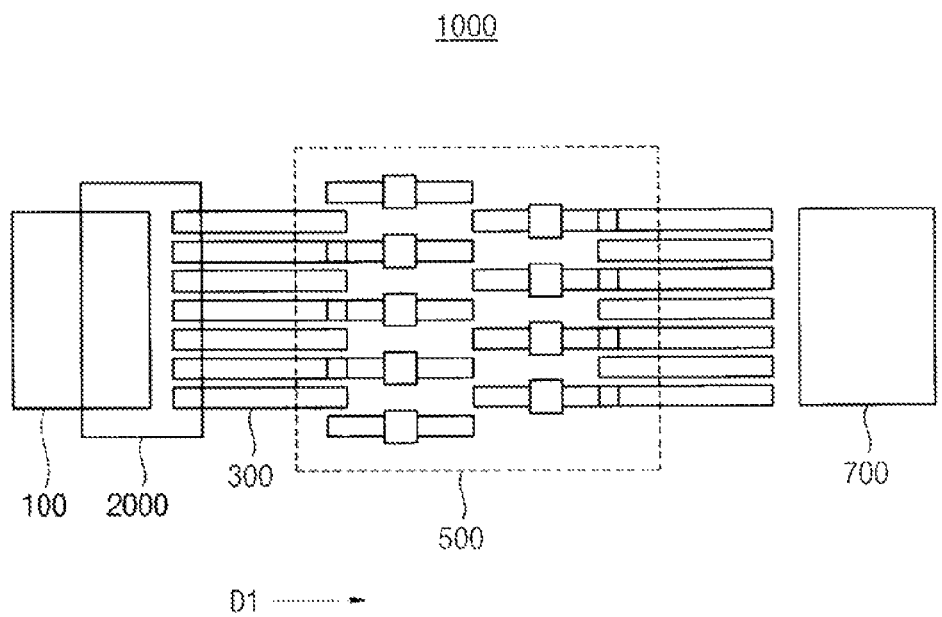
FIG. 1 is a plan view illustrating an exposure apparatus according to a first example embodiment in accordance with the present disclosure.

FIG. 1 is a plan view illustrating a first exposure apparatus 1000 for use with a corresponding mother substrate 2000 and structured and operated according to a first example embodiment.

Referring to FIG. 1, the first exposure apparatus 1000 includes an inloading part 100, a through-transfer stage 300, an exposure part 500 and an unloading part 700. It is to be understood with regard to the through-transfer stage 300 that in this embodiment, the mother substrate 2000 is advanced in discrete steps, or continuously, through the part of the first exposure apparatus 1000 where the exposure part 500 is located. Although the drawn area of the exposure part 500 is greater than the drawn area of the mother substrate 2000, the exposure part 500 is drawn to show small square areas whose sum of vertical lengths (vertical in the figure) is substantially equal to the vertical, to-be-exposed length the advanced therethrough mother substrate 2000.

The inloading part 100 of FIG. 1 loads a next to be processed mother substrate 2000 from outside of the exposure apparatus 1000, to a clean interior of the exposure apparatus 1000 so that the substrate 2000 can be appropriately exposed to a desired photomask pattern within the exposure apparatus 1000.

The transfer stage 300 transfers the substrate 2000 from the inloading part 100 to and through the exposure part 500 by moving the mother substrate 2000 along a first direction D1. Later, the transfer stage 300 transfers the exposed substrate 2000 from the exposure part 500 to the unloading part 700. The through-transfer stage 300 extends along the first direction D1.

The substrate 2000 may be exposed by a continuous scan type or a step type of exposure process. In the scan type exposing process, the transfer stage 300 may continuously transfer (advance) the substrate 2000 at a steady pace through the exposure part 500. In the step type exposing process, the transfer stage 300 discontinuously advances the substrate 2000 with repetition of move and stop steps. When a continuous strip pattern is to be formed on the substrate 2000, the scan type exposing may be preferably applied. When spaced apart island patterns are to be formed on the mother substrate 2000, the step type exposing process may be preferably applied. In one embodiment, the exposure apparatus 1000 is capable of selectively providing either type of advancement at appropriate times or under appropriate conditions.

The transfer stage 300 may use a magnetic levitation method (e.g., repulsed and moved electromagnets) to advance the substrate 2000 through the exposure part 500.

The exposure part 500 supplies irradiating light to the passing through portions of the substrate 2000, which substrate is advanced by transfer stage 300, to thus form an irradiated pattern on the whole of substrate 2000 but with use of one or more smaller sized photomasks. The fixed (relatively stationary) exposure part 500 exposes the substrate 2000 that is moving therethrough in the first direction D1 so that the collective pattern on the moving-through substrate 2000 develops in a direction opposite to the first direction D1.

The exposure part 500 may include a plurality of exposure modules. The exposure modules may be disposed in a plurality of columns as shown. For example, the exposure modules may be disposed in two spaced apart columns. The exposure modules in a first column are alternately disposed in the vertical direction with the exposure modules in the second column so that the entire vertical length of the mother substrate 2000 can be entirely exposed by passing through all the exposure modules. As shown in FIG. 1, five exposure modules may be disposed in the first column, and four, interdigitally located exposure modules may be disposed in the second column.

A structure and an operation of the exposure part 500 are now explained below in more detail.

The unloading part 700 unloads the substrate 2000, on which the pattern is formed, to further processing stations outside the clean interior of the exposure apparatus 1000.

The substrate 2000 may be a thin film transistors (TFTs) substrate or a color filters substrate, which are common elements of a liquid crystal display (LCD) panel of an LCD apparatus displaying an image. The TFTs substrate may include TFTs disposed in a matrix pattern on a glass substrate to serve as switching elements. The color filter substrate may include red, green and blue pixel filters.

Figure 2:
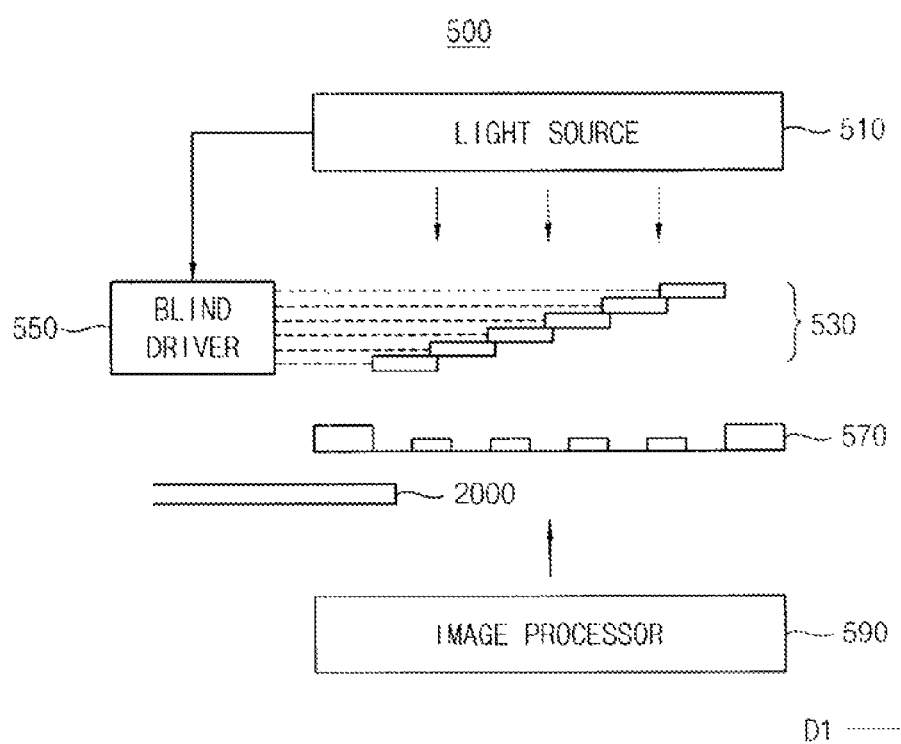
FIG. 2 is a conceptual diagram illustrating an exposure part of the exposure apparatus of FIG. 1.
Figure 3:
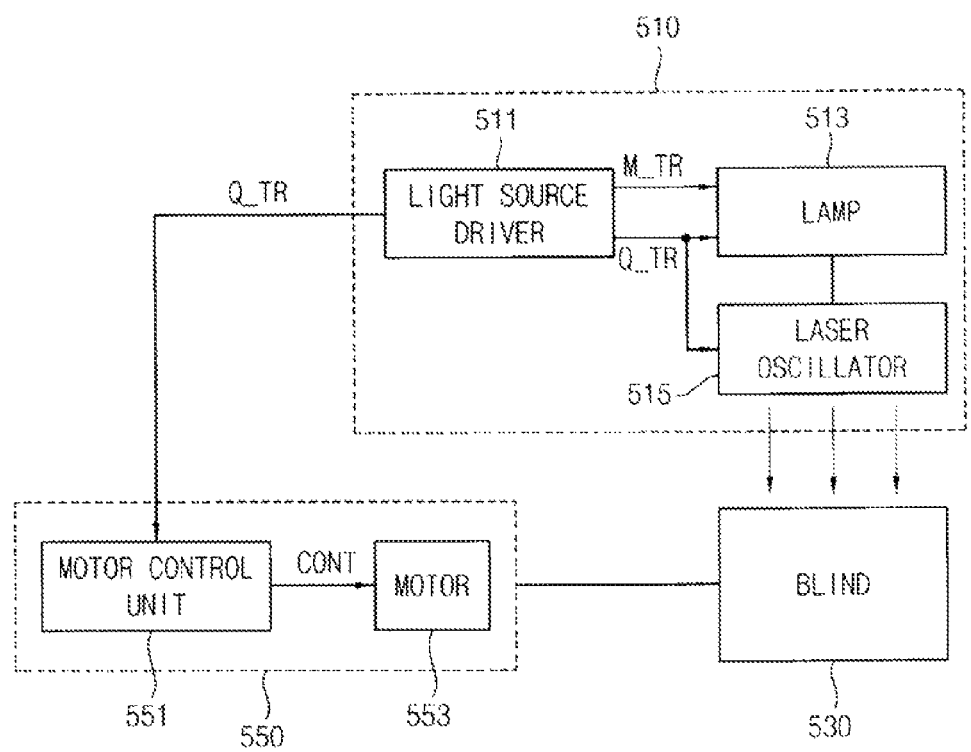
FIG. 3 is a block diagram illustrating a portion of the exposure part of FIG. 2.
Figure 4:
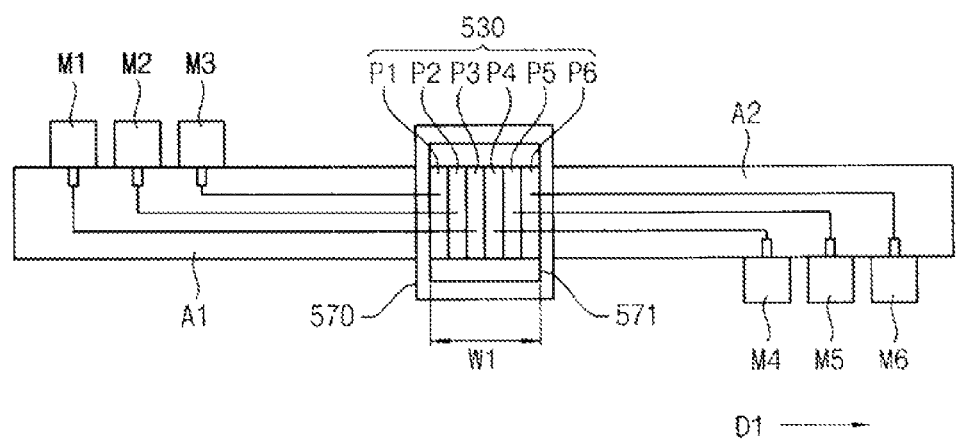
FIG. 4 is a plan view to explain an operation of a blind of FIG. 2.

FIG. 2 is a conceptual diagram illustrating an exposure part 500 of the exposure apparatus 1000 of FIG. 1. FIG. 3 is a block diagram illustrating a portion of the exposure part 500 of FIG. 2. FIG. 4 is a top plan view to explain an operation of a blind 530 of FIG. 2. As will become more apparent when FIGS. 8B-8E are described, in one embodiment, the blind 530 operates as a variable length and placement blind whose shadow first shrinks toward one end (e.g., the exit end) of the exposure window area and then grows out again from a second end (e.g., the substrate entry end) of the exposure window area.

Referring first however to FIGS. 2 to 4, the exposure part 500 is seen to include a light source 510, one or more movable and variable length blinds 530, a blind(s) driver 550, a photomasks retainer 570 that retains a supplied photomask (also referenced as 570) and an image processor 590. The exposure part 500 may include a plurality of exposure modules each having a respective photomask that is smaller in area than is the mother substrate 2000. Each of the exposure modules may include its own light source 510, its own variable length blind 530, its own blind driver 550, its own small-sized mask retainer and corresponding mask 570 and its own alignment assisting image processor 590. The light source 510 is disposed over the blind(s) 530 and over the photomask(s) 570 so as to irradiate its light (e.g., flashed laser light) towards non-blinded parts of the mask 570 and corresponding non-blinded parts of the advancing through mother substrate 2000. The light may be irradiated as rays beamed in a direction substantially perpendicular to a major surface plane of the mask(s) 570.

In one embodiment, the light source 510 includes a light source driver 511, an excitation lamp 513, and a lamp-excited laser oscillator 515. The excitation lamp 513 may include a mercury flash lamp. The laser oscillator 515 may include an nd-YAG laser oscillator (e.g., nd-YAG medium with mirrored ends). The light source 510 may include a light concentrating part (not shown, e.g., a reflective type) which concentrates the light output from the laser oscillator 515. The light concentrating part may include at least one reflective lens structure.

The light source driver 511 outputs a master trigger signal M_TR and a laser oscillation start signal Q_TR to the lamp 513.

The lamp 513 emits one or more excitation flashes of light in response to the master trigger signal M_TR. The lamp 513 stops emitting its light in response to the laser oscillation start signal Q_TR.

The laser oscillator 515 develops an oscillating laser beam within based on the excitation light received from the lamp 513 and in response to the laser oscillation start signal Q_TR.

The light source 510 emits its laser-produced light in a predetermined cycle. For example, when a frequency of the light source 510 is about 50 Hz, the light sourcing cycle may be about 20 msec in full duration. However the laser oscillation output period is very short (much shorter than 20 msec) in its light emitting cycle. Thus, a non-output period of the laser may be substantially 20 msec.

The variable length blind 530 is disposed over an exposure window area 571 (FIG. 4) that is also overlapped by the photomask 570. The variable length of the blind 530 is such that the blind 530 can block all the light irradiated from the light source 510 so as not to pass any of it through the mask 570 and onto a corresponding fully-blinded part of mother substrate 2000. The variable length blind 530 may thus be used to fully block a not-to-be-exposed area of the substrate 2000.

In one embodiment, the variable length blind 530 include a plurality of movable blocking plates P1, P2, P3, P4, P5 and P6. For example, the blind 530 may include six movable and overlappable blocking plates P1, P2, P3, P4, P5 and P6.

The variable length blind apparatus 530 of FIG. 4 extends in the first direction D1 beyond both sides of the exposure window (571) and the movable blocking plates P1 to P6 may be moved out of the exposure window (571) and into either one of the plate acceleration/deceleration areas A1 and A2 (also referred to here as moving areas A1 and A2) respectively disposed at opposite ends (entry and exit ends) of the exposure window area (571).

The movable blocking plates P1 to P6 may be respectively disposed in planes different from each other, and may be moved individually into desired positions including those within exposure window 571 and those within the outside moving areas A1 and A2. The blocking plates P1 to P6 may be formed to be overlapped with each other in a plan view. The blocking plates P1 to P6 may be distributed along the first direction D1, and may each extend longitudinally in a direction substantially perpendicular to the first direction D1. Each of the blocking plates P1 to P6 may have a rectangular or other parallelepiped shape. The blocking plates P1 to P6 may include a carbon fiber material or other appropriate material that absorbs or blocks light.

The blind(s) driver 550 includes a motor control unit 551 and a plurality of motors 553. The motor control unit 551 outputs a motor control signal CONT to individually control the various motors 553. The motors 553 are respectively connected to respective ones of the individually movable blocking plates P1 to P6.

Referring to FIG. 4, the motors M1 to M6 are respectively connected to respective blocking plates P1 to P6. More specifically, the first electrical motor M1 is mechanically coupled to the first blocking plate P1. The second motor M2 is mechanically coupled to the second blocking plate P2. The third motor M3 is mechanically coupled to the third blocking plate P3. The fourth motor M4 is mechanically coupled to the fourth blocking plate P4. The fifth motor M5 is mechanically coupled to the fifth blocking plate P5. The sixth motor M6 is mechanically coupled to the sixth blocking plate P6. The motors M1 to M6 may be respectively connected to the blocking plates P1 to P6 each through a respective chain or belt or other appropriate mechanical coupling means. Although not shown in the figures, the movable blocking plates P1 to P6 may be guided in their movements by moving on additional guide rails.

The motors 553 move their respective blocking plates P1 to P6 in response to the motor control signal CONT. The motor control signal CONT may include a forward moving command signal that instructs to move an identified one or more of the blocking plates P1 to P6 in the first direction D1 and a return moving command signal that instructs to return an identified one or more of the blocking plates P1 to P6 in a second direction opposite to the first direction D1. The speed of movement may be varied and also controlled by the motor control signal CONT. The motors 533 can thus be commanded to move their respective blocking plates P1 to P6 in the first direction D1 in response to the forward moving signal and to return their respective blocking plates P1 to P6 in the second direction in response to the return moving signal. The forward and return speeds may be varied.

The motor control unit 551 receives a timing synchronization signal such as the laser oscillation start signal Q_TR from the light source driver 511 so that the motor control unit 551 can thus determine when the laser is in its laser output mode and when it is not. In other words, the motor control signal CONT of the motor control unit 551 can be thus synchronized with the timing of the laser oscillation start signal Q_TR.

Accordingly, the forward and return movement signals in the motor control signal CONT may be synchronized with firings of the laser oscillation start signal Q_TR.

The mask or set of mini-masks 570 is/are disposed in corresponding mask retaining/aligning parts provided over the substrate 2000, and it/they are also disposed under the variable length blind 530. Each mask 570 overlaps with the pattern exposure window 571 that transmits the pattern-modified light irradiated from the light source 510 to unblinded portions of the mother substrate 2000. The mask 570 may include patterns for forming rectangularly shaped pixel electrodes or zigzag shaped pixel electrodes or other structures of a monolithically integrated LCD mother substrate as appropriate for different applications.

The exposure window 571 may have a rectangular shape. For example, a width W1 in the first direction D1 may be about 60 mm.

The image processor 590 is disposed under the substrate 2000 and the mask 570. The image processor 590 reads one or more preset alignment patterns formed on the mother substrate 2000 to establish and/or correct positional alignment between the substrate 2000 and the mask 570. The image processor 590 is operatively coupled to the mask retaining/aligning part(s) for sending alignment maintaining or improving signals to the respective one or more mask retaining/aligning parts (not shown).

Figure 5:
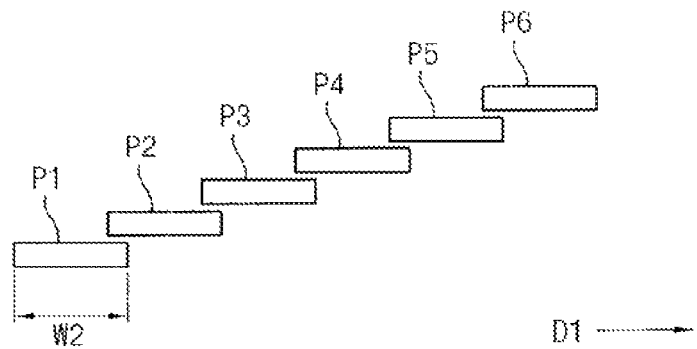
FIG. 5 is a front view illustrating a shape of the blind of FIG. 2.

FIG. 5 is a side view illustrating an overlapped and height-staggered plates shape of the blind 530 of FIG. 2.

Referring to FIGS. 2 and 5, the blind 530 includes six movable blocking plates P1 to P6. The blocking plates P1 to P6 may be respectively disposed in planes different from each other. The blocking plates P1 to P6 may be formed to be overlapped with each other in a plan view.

The blocking plates P1 to P6 are gradually disposed on higher planes as one moves along the first direction D1. For example, the second blocking plate P2 is disposed higher than the first blocking plate P1. The third blocking plate P3 is disposed higher than the second blocking plate P2. The fourth blocking plate P4 is disposed higher than the third blocking plate P3. The fifth blocking plate P5 is disposed higher than the fourth blocking plate P4. The sixth blocking plate P6 is disposed higher than the fifth blocking plate P5.

The shape of the blocking plates P1 to P6 is not limited to the above explained shape. For example, the blocking plates P1 to P6 may be gradually disposed on lower planes along the first direction D1. Alternatively, the heights of the blocking plates P1 to P6 may gradually increase and gradually decrease when moving along the first direction D1.

The blocking plates P1 to P6 may have sizes substantially the same with each other. Accordingly, widths W2 of the blocking plates P1 to P6 in the first direction D1 may be substantially the same with each other. For example, the width W2 in the first direction D1 may be from about 9 mm to about 17 mm.

Figure 6:
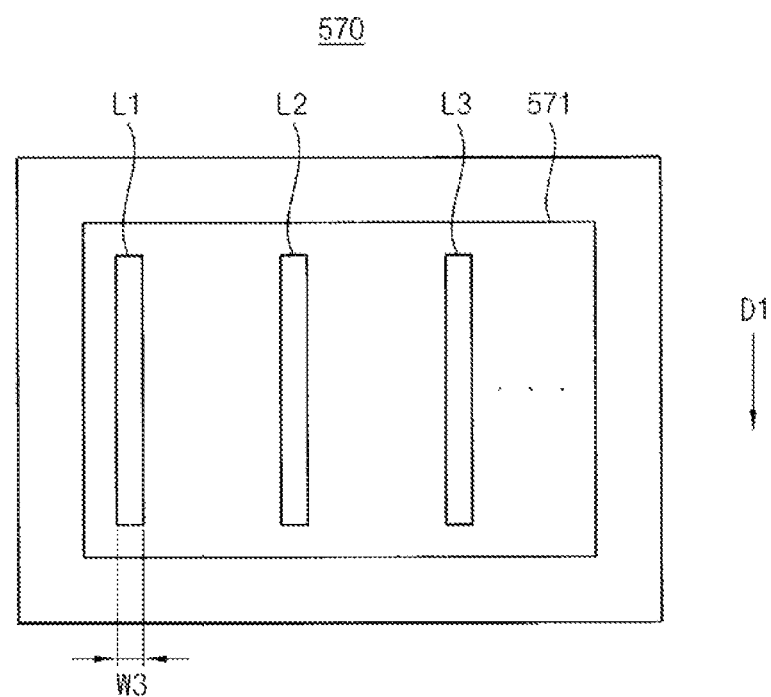
FIG. 6 is a plan view illustrating a mask of FIG. 2.

FIG. 6 is a plan view illustrating an exemplary photomask 570 of FIG. 2.

Referring to FIGS. 2 and 6, the exemplary photomask 570 is plurality of so as to form respective vertical stripes of an RGB striped color filter substrate. The mask 570 includes the exposure window 571. Light blocking patterns L1, L2 and L3 extending in the first direction D1 are formed in the exposure window 571. (Light blocking is assumed for the interiors of L1-L3 if the corresponding photoresist is a positive one whose shadow covered areas become hardened. In an opposite case where a negative photoresist is used, the interiors of L1-L3 may be light-passing ones while the surrounding area of the photomask is light-blocking.) A width W3 of a first pattern L1 in a direction substantially perpendicular to the first direction D1 corresponds to a width of a single pixel of the LCD panel.

The color filter having a first color pixel, a second color pixel and a third color pixel may be formed using the mask 570. The first color pixel may be a red (R) pixel. The second color pixel may be a green (G) pixel. The third color pixel may be a blue (B) pixel. A first colored photoresist layer, a second colored photoresist layer and a third colored photoresist layer may be sequentially deposited and patterned with an appropriately translated instance of mask 570 of FIG. 6 to form vertical stripes of cured color filter material for the first, second and third colored pixels, respectively.

A light blocking pattern (black matrix) may be formed in boundaries between the first, second and third pixels of the substrate 2000.

In one embodiment, the first colored photoresist layer is coated on the substrate 2000 on which the light blocking pattern is already preformed. The light is irradiated through the mask 570 to thus develop hardened PR material corresponding to mask patterns L1-L3, whereafter the selectively cured PR material is subjected to etching that selectively removes the uncured PR material so that the first colored color filters of same colored pixels are formed corresponding to the illustrated exemplary patterns L1, L2 and L3.

Next, the second colored photoresist layer is coated on the substrate 2000 on which the light blocking pattern and the first colored color filter stripes are formed. Prior to exposure, and in one embodiment, the mask 570 is moved in a direction substantially perpendicular to the first direction D1 of FIG. 6. The light is irradiated through the translated mask 570 to thus define stripes in the second colored photoresist layer so that the second color filter stripes are formed adjacent to the first color filter stripes corresponding to the same striped patterns L1, L2 and L3. In an alternate embodiment, rather than translating the mask 570 prior to exposure of the second colored photoresist layer, the mother substrate 2000 is instead moved by a corresponding distance so as to produce substantially the same effect.

Next, the third color photoresist layer is coated on the substrate 2000 on which the light blocking pattern, the first color pixels and the second color pixels are formed. The mask 570 is moved again in the direction substantially perpendicular to the first direction D1 of FIG. 6. The light is irradiated to the mask 570 to etch the third color photoresist layer so that the third color pixels are formed adjacent to the second color pixels corresponding to the patterns L1, L2 and L3. In an alternate embodiment, rather than translating the mask 570 prior to exposure of the third colored photoresist layer, the mother substrate 2000 is instead moved by a corresponding distance so as to produce substantially the same effect.

In one embodiment, each of the first, second and third photoresist layers is a negative development photoresist layer.

The shape of the patterns on the supplied mask 570 is not limited to the above explained shape. Alternatively, the mask 570 may be used for forming the TFT substrate. The mask 570 may include the exposure window 571. The patterns forming a matrix form may be disposed in the exposure window 571. A size of the single pattern may correspond to a size of a single pixel of the liquid crystal display panel.

The TFT substrate may be formed using the mask 570. Each of the first, second and third color photoresist layers may be a positive photoresist layer in which a portion not irradiated by the light remains during subsequent etching.

Figure 7:
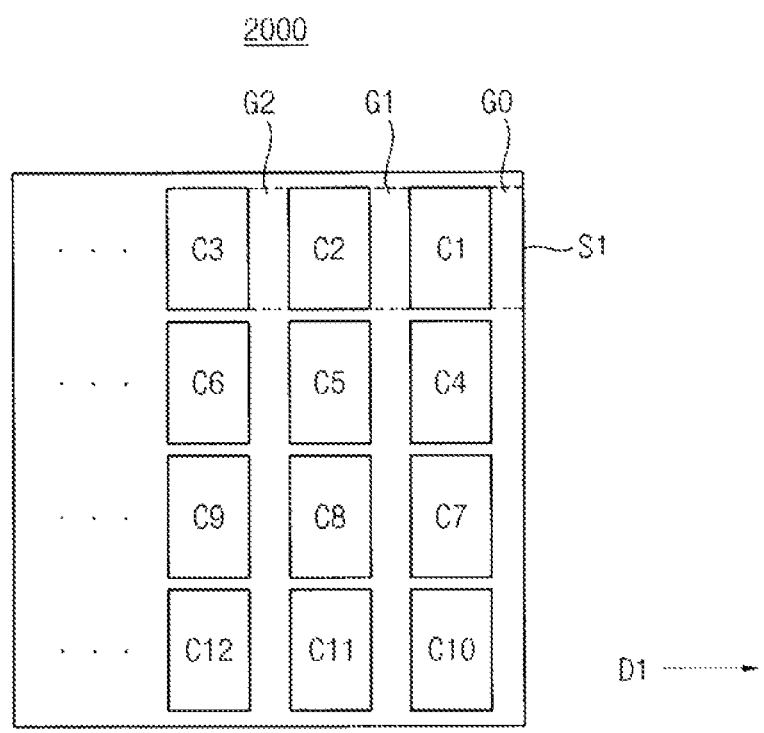
FIG. 7 is a plan view illustrating a substrate exposed by the exposure part of FIG. 2.
Figure 8A:
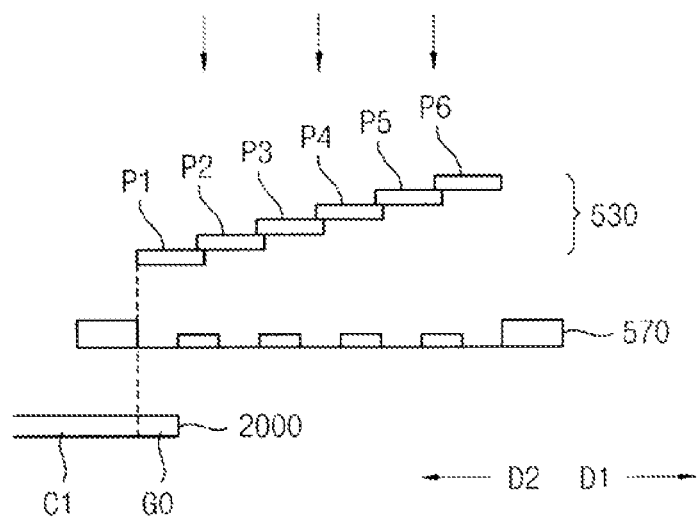
FIGS. 8A and 8E are conceptual diagrams to sequentially explain an exposure process using the exposure part of FIG. 2.

FIG. 7 is a plan view illustrating a mother substrate 2000 exposed by the exposure part 500 of FIG. 2. FIGS. 8A and 8E are conceptual diagrams to sequentially explain a corresponding exposure process using the exposure part 500 of FIG. 2.

Referring to FIGS. 2 and 7, the mother substrate 2000 includes a plurality of daughter cells C1, C2, C3, . . . Each single cell corresponds to a single liquid crystal display panel which will be cutout from the mother substrate 2000 after integrated circuit formation on the mother substrate is completed. The cells C1, C2, C3, . . . may be disposed in a plurality of rows. For example, the cells C1, C2, C3, . . . may be disposed in four rows.

As shown for an exemplary first row, an initial non-exposed area G0 is disposed between an entry starting, first side 51 of the mother substrate 2000 and the first to-be-patterned cell C1. A next, non-exposed (not patterned) columnar area G1 is disposed between the left side of the first cell C1 and the right side of the second cell C2. A next non-exposed area G2 is disposed between the left side of the second cell C2 and the right side of the third cell C3. The pattern may continue for a larger number of columns of cells.

FIG. 8A is a conceptual diagram illustrating the start of an exposure process wherein only the initial non-exposed area G0 has advanced into, and is therefore disposed in the exposure window area 571 of the mask 570.

Referring to FIGS. 2, 7 and 8A, in this phase of the process the blocking plates P1 to P6 of the blind 530 are spread out so as to entirely block the exposure window 571. In other words, the blocking length of the variable length blind is at maximum. Thus, although the light from the light source 510 is irradiated to the exposure window 571, the initial non-exposed area G0 of the substrate 2000 is not exposed and patterned by any overlying pattern in the photomask 570.

Figure 8B:
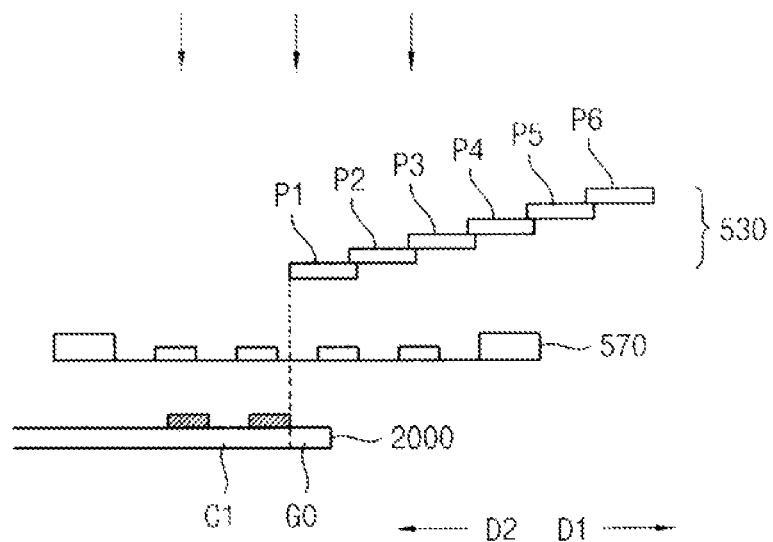

FIG. 8B is a conceptual diagram illustrating a next step in the blind-controlled exposure process wherein the initial non-exposed area G0 has advanced deeper into area 571, a trailing edge of plate P1 has followed along with area G0 and the first cell C1 has advanced into area 571 so as to be disposed under the two leftmost raised patterns of the mask 570.

Comparing FIGS. 8A and 8B, it is seen that the blocking plates P1 to P6 of the variable length blind 530 of later in time FIG. 8B have each advanced slightly in the first direction D1 such that shadow edge forming left end of plate P1 tracks the left edge of the initial non-exposed area G0. To accomplish this, a first velocity of each of the blocking plates P1 to P6 in the first direction D1 is substantially the same as an advancement velocity of the substrate 2000 in the first direction during the time period between the state of FIG. 8A and the state of FIG. 8B.

More specifically and as mentioned, a shadow edge defining side of the first blocking plate P1 coincides with a boundary between the initial non-exposed area G0 and the first cell C1. The first to third blocking plates P1, P2 and P3 are disposed over the exposure window 571 to prevent the light from being irradiated to the initial non-exposed area G0 and areas to the right of it.

Figure 8C:
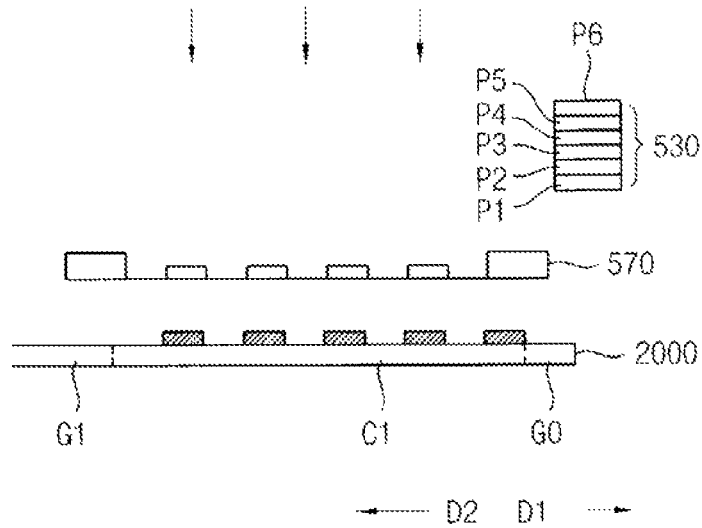

FIG. 8C is a conceptual diagram illustrating a next step in the exposure process wherein the first cell C1 has advanced yet deeper into the exposure window 571 so as to have its 4 left ones of its raised patterns disposed under a corresponding 4 raised patterns inside the exposure window area 571 of the mask 570. At the same time, the light blocking plates P1 to P6 have advanced more rapidly in the first direction D1 (to the right) so as to be disposed outside the right boundary of the exposure window 571.

Comparing FIGS. 8B and 8C, it is seen in FIG. 8C that all of the blocking plates P1 to P6 are disposed outside of the exposure window 571 after having moved in the first direction D1 so as not to block the exposure window 571. A part of the first cell C1 fully occupies the exposure window area 571.

Figure 8D:
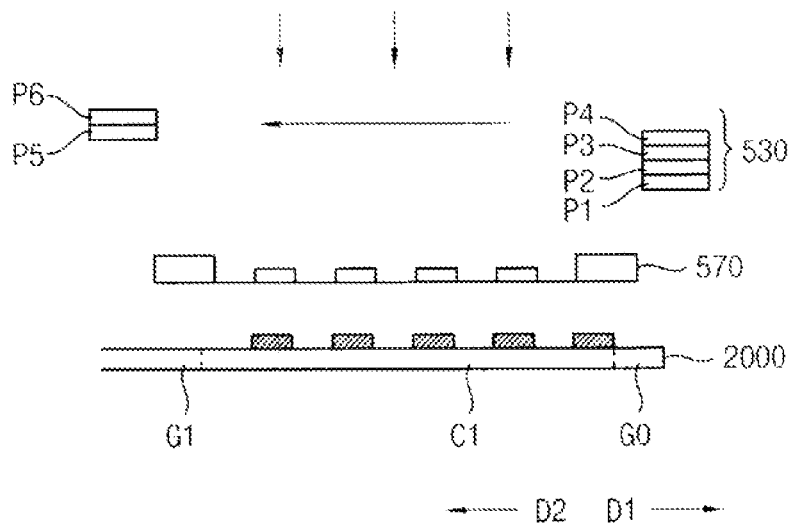
Figure 8E:
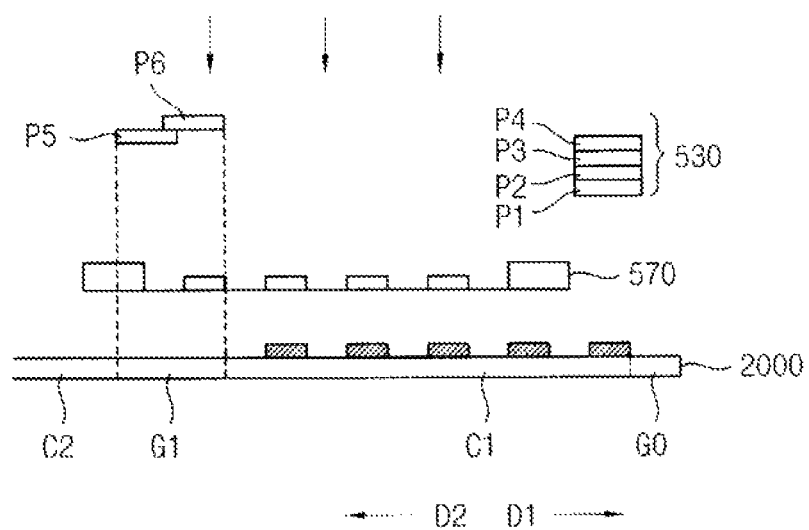

FIG. 8D is a conceptual diagram illustrating a next step in the exemplary exposure process wherein the first cell C1 is still fully occupying the exposure window area 571 of the mask 570, but where some of the light blocking plates, namely, P5 and P6 have been returned in the second direction D2 (opposite D1) so as to reside in the far left waiting area (A1) outside the exposure window area 571.

Referring to FIGS. 8C and 8D, the first cell C1 of FIG. 8D is still disposed in the exposure window 571. In addition, the first non-exposed area G1 between the first cell C1 and the second cell C2 is disposed just outside the left boundary of the exposure window 571 ready to enter that exposure window 571 by moving in the first direction D1. The fifth and sixth plates P5-P6 are poised above the first non-exposed area G1 so as to move with it as it next enters the exposure window area 571.

In other words, when the first non-exposed area G1 is next moved into the exposure window 571, some of the blocking plates, P5 and P6 for example are disposed outside of the left end of exposure window 571 so that they can next move in the first direction D1 to thereby block light from striking the first non-exposed area G1 as G1 enters from the left.

To accomplish this, all of the blocking plates P1 to P6 may be returned to block the first non-exposed area G1. Alternatively, only a subset (e.g., P5 and P6) of the blocking plates P1 to P6 may be returned to provide blockage for the first non-exposed area G1. The number of the blocking plates that are to returned may be determined based on a width of the first non-exposed area G1 in the first direction D1.

In one embodiment, a second velocity ($V_2$) of the blocking plates P5 and P6 returned in the second direction D2 is made greater than the first velocity.

More specifically, the second velocity $V_2$ of the blocking plates P5 and P6 to pass through the exposure window area 571 may satisfy a condition of $$V_2 \geq \frac{(W1 + W2)}{\lambda}.$$

Here, W1 is a width of the exposure window 571 as measured along the first direction D1, W2 is a width of the blocking plate in the first direction D1, and $\lambda$ is the light emitting cycle duration of the excitational light source 513. For example, in one embodiment, W1 is about 60 mm, W2 is about 17 mm, $\lambda$ is about 20 msec, and the second velocity $V_2$ is thus substantially equal to or greater than 3850 mm/sec. In another example, W1 is about 60 mm, W2 is about 9 mm, $\lambda$ is about 20 msec, and the second velocity $V_2$ is substantially equal to or greater than 3450 mm/sec.

When the blocking plates P5 and P6 pass through the exposure window 571 with the relatively large second velocity $V_2$ which satisfies the above condition, the blocking plates P5 and P6 may pass through the exposure window 571 during a non-emitting period of the laser light source 515. Thus, the rapidly-returned blocking plates P5 and P6 will not substantially block the laser light irradiated to the first cell C1 which at the time has a portion thereof positioned in of the exposure window area 571. When the blocking plates P5 and P6 do not block the light irradiated to the exposed area, a stain due to a difference of the light quantity in the exposed area may be prevented.

FIG. 8E is a conceptual diagram illustrating a next step in the exposure process wherein the first cell C1 and the first non-exposed area G1 have advanced further to the right (in direction D1) so to be both disposed in the exposure window area 571 of the mask 570.

Comparing FIGS. 8D and 8E, it is seen in FIG. 8E that the fifth and sixth blocking plates, P5 to P6 of the variable length blind 530 have advanced along in the first direction D1 so as to track the advancement of the first non-exposed area G1 into the exposure window area 571. The fifth to sixth blocking plates P5 and P6 thus prevent the light from being irradiated to the first non-exposed area G1.

In addition, when the fifth and sixth blocking plates P5 and P6 are moved out of the exposure window 571 in the first direction D1 as explained referring to FIG. 8C and the second non-exposed area G2 between the second and third cells C2 and C3 is ready to move into the exposure window 571 as explained referring to FIG. 8D, some of the blocking plates P1 to P6 may be returned in the second direction D2 to block the second non-exposed area G2.

The process explained above may be repeated until the substrate 2000 completely exits the exposure part 500.

Figure 9:
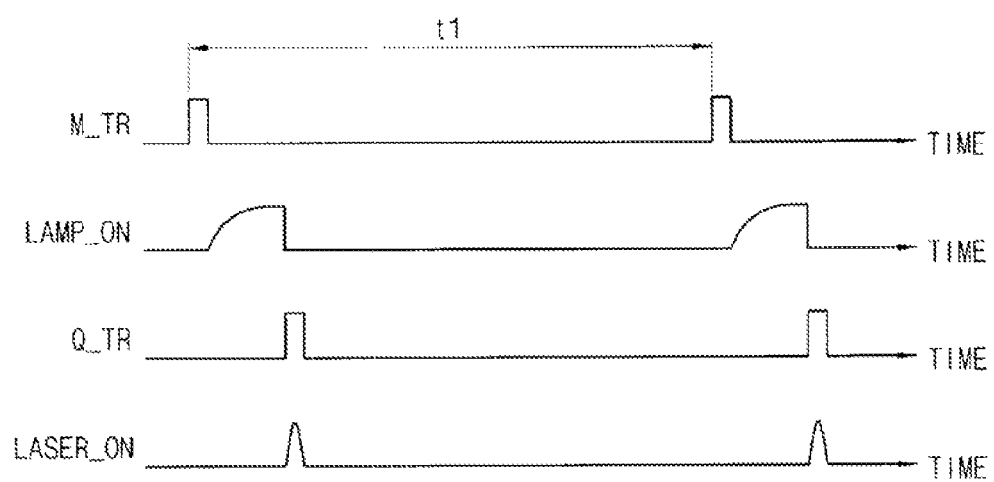
FIG. 9 is a set of timing diagrams to explain an operation of a light source of FIG. 2.

FIG. 9 provides a set of timing diagrams to explain an operation of the light source 510 of FIG. 2.

Referring to FIGS. 2, 3, and 9, the light source driver 511 outputs the master trigger signal M_TR and the laser oscillation start signal Q_TR to the lamp 513 in accordance with the illustrated time points.

When the master trigger signal M_TR is turned on, a lamp emitting signal LAMP_ON is turned on after a predetermined time. The lamp 513 emits the light based on the lamp emitting signal LAMP_ON. A laser beam may be generated using the excitation light from the lamp 513.

When the laser beam generated during a turn on time of the lamp emitting signal LAMP_ON, the light source driver 511 outputs the laser oscillation start signal Q_TR to the lamp 513.

When the laser oscillation start signal Q_TR is turned on, the lamp emitting signal LAMP_ON is turned off. The excitation lamp 513 stop emitting the light based on the lamp emitting signal LAMP_ON. In addition, when the laser oscillation start signal Q_TR is turned on, a laser oscillation signal LASER_ON is turned on based on the laser oscillation start signal Q_TR. The laser oscillator 515 outputs its corresponding laser beam during a relatively short time based on the laser oscillation signal LASER_ON.

The light source 510 may include an amplifying part (e.g., a concentrator not shown) amplifying the light from the lamp 513 to generate a stronger laser beam.

The light source 510 emits the light in accordance with a predetermined cycle duration. For example, when a frequency of the light source 510 is about 50 Hz, the light emitting cycle t1 may be about 20 msec.

The lamp 513 emits the light in response to the master trigger signal M_TR. The lamp 513 stops emitting the light in response to the laser oscillation start signal Q_TR.

The laser oscillator 515 oscillates the laser beam in response to the laser oscillation start signal Q_TR.

The laser oscillation start signal Q_TR may be turned on in about 1 msec after the master trigger signal M_TR is turned on.

The laser oscillation period is very short in the light emitting cycle t1. For example, the laser oscillation output period may be between about 5 nsec and about 7 nsec. Accordingly, the non-emitting period of the laser may be between 19.993 nsec and about 19.995 nsec.

Figure 10:
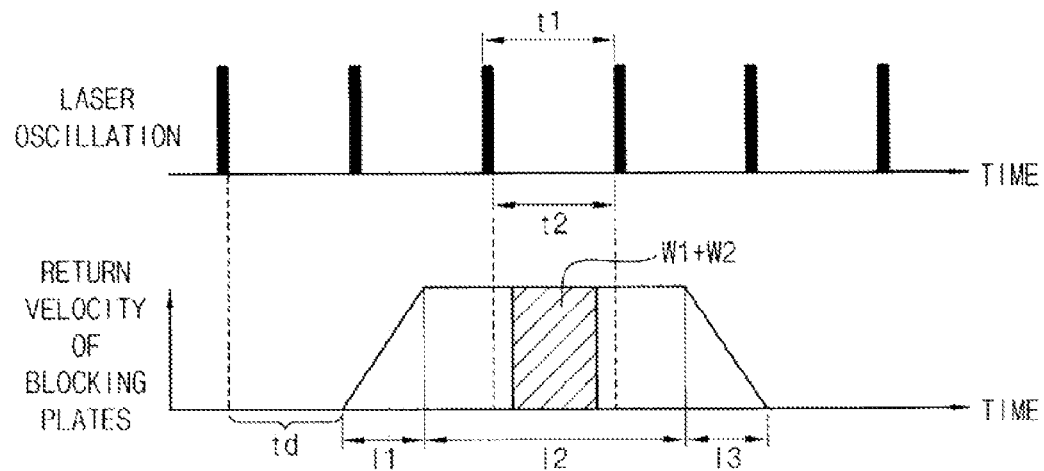
FIG. 10 is a set of timing diagrams to explain a return operation of the blocking plates of FIG. 2.

FIG. 10 provides a set of timing diagrams to explain a return operation of the blocking plates P5 and P6 of FIG. 8D.

Referring to FIGS. 2, 8D, 9 and 10, a process will now be explained in more detail regarding how some blocking plates (e.g., P5 and P6) among the blocking plates P1 to P6 may be rapidly returned along the second direction D2 in between the laser firings.

The blocking plates P5 and P6 pass through the exposure window 571 with the second velocity $V_2$ satisfying the above inequality condition so that the blocking plates P5 and P6 may pass through the exposure window 571 during the laser non-emitting period of the light source 510.

A signal of the light source 510 may be synchronized with the motor control signal CONT to control the blocking plates P5 and P6 to pass through the exposure window 571 during the laser non-emitting period of the light source 510. For example, the return signal to return the blocking plates P5 and P6 in the second direction D2 may be synchronized with the laser oscillation start signal Q_TR. The return signal may be delayed by a predetermined delay time td with respect to the pulsing (or other firing) of the laser oscillation start signal Q_TR.

The second velocity $V_2$ of the blocking plates P5 and P6 in the exposure window area 571 may satisfy a condition of $$V_2 \geq \frac{(W1 + W2)}{t2}$$

during the laser non-emitting period of the light source 510 in order to pass through the exposure window area 571 without creating a shadow stain. Here, W1 is a width of the exposure window 571 in the first direction D1, W2 is a width of the blocking plate in the first direction D1, and t2 is the non-emitting period of the light source 510.

In FIG. 10, the trapezoidal area formed by the horizontal time axis and the return velocity profile of the blocking plate represents a returning travel distance of the corresponding blocking plate. When the second velocity $V_2$ satisfies the above inequality condition, the blocking plate is translated during the corresponding time period by a distance of at least W1+W2 which translation distance is greater than the total width W1 of the exposure window 571 and which translation distance is sufficient to get all parts of the corresponding blocking plate beyond the exposure window 571. The minimum translation distance of W1+W2 is represented in the time versus velocity graph of FIG. 10 as a cross-hatched rectangular shape that is centered within the laser non-emitting period t2 of the light source 510.

In addition, the laser emitting period of the light source 510 is very short, so that the condition of the second velocity $V_2$ may be approximated as the following inequality:

$$V_2 \geq \frac{(W1 + W2)}{t1}.$$

Here, t1 is the period of the laser emitting cycle of the light source 510.

In order to fully pass through the exposure window 571 during the non-emitting period t2 of the light source 510 at the desired high velocity, the return operation of the corresponding blocking plate may include an acceleration period I1, a constant velocity period I2 and a deceleration period I3.

In the acceleration period I1, the return velocity of the respective blocking plate (e.g., P5 and P6) gradually increases linearly or otherwise from zero to the desired high velocity $V_2$. In other words, for one embodiment and in the acceleration period I1, the return velocity of the blocking plates P5 and P6 is linearly increased from 0 to a predetermined value for the second velocity $V_2$.

In the constant velocity period I2, the predetermined value for the second velocity $V_2$ of the blocking plates P5 and P6 constantly maintained. In the constant velocity period I2, the return velocity of the blocking plates P5 and P6 may maintain the second velocity $V_2$ satisfying one of the above inequality conditions.

In the deceleration period I3, the return velocity of the blocking plates P5 and P6 gradually decreases linearly or otherwise. In the deceleration period I3, the return velocity of the blocking plates P5 and P6 may decrease from the second velocity $V_2$ to 0. The trapezoidal velocity profile illustrated as an example in FIG. 10 is to be understood as being a nonlimiting example and other methods for getting the returning plates (e.g., P5 and P6) to pass through the exposure window area 571 without creating a stain may be used, as shall become evident from other embodiments described below.

Referring to FIGS. 4 and 10, in one embodiment, the blocking plates P5 and P6 accelerate within the second moving area A2 during the acceleration period I1 and are still within the second moving area A2 at the start of the constant velocity period I2. The blocking plates P5 and P6 pass into the first moving area A1 while still operating in the constant velocity period I2 and then they slow down within the first moving area A1 during the deceleration period I3.

In the present example embodiment, the laser non-emitting period t2 is entirely included in the constant velocity period I2. The blocking plates P5 and P6 (in the embodiment of FIG. 8D) are each translated through the total minimum width of W1+W2 so as to get them completely outside of the exposure window 571 by using the constant velocity portion of the profile in which the maximum velocity is the second velocity $V_2$.

Figure 11:
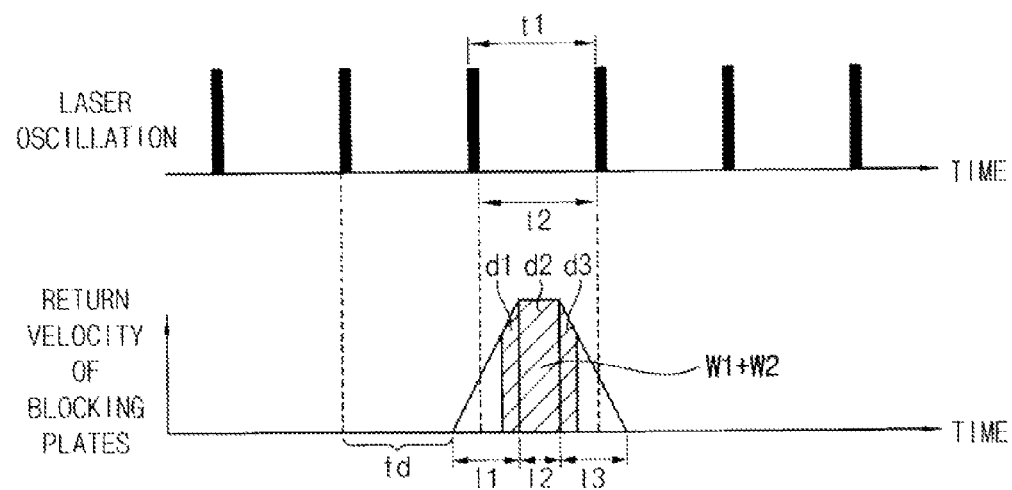
FIG. 11 is a set of timing diagrams to explain a return operation of the blocking plates of FIG. 2 according to another example embodiment.

FIG. 11 is a set of timing diagrams to explain a return operation of the blocking plates P5 and P6 of FIG. 8D according to another example embodiment.

The return operation of the blocking plates P5 and P6 according to the second example embodiment of FIG. 11 is almost the same as the return operation of the blocking plates P5 and P6 according to the previous example embodiment (FIG. 10) except for the fact that the maximum return velocity of the blocking plates P5 and P6 in FIG. 11 is greater than $V_2$. Same reference numerals will be used to refer to the same or like parts as those described in the previous example embodiment of FIGS. 1 to 10 and any repetitive explanation concerning the above elements will thus be omitted.

Referring to FIGS. 2 and 11, a durations-weighted average of the alternate velocity profile $V_{alt}$ shown for the blocking plates P5 and P6 in FIG. 11 may satisfy the weighted average inequality condition of $$V_{alt} \geq \frac{(W1+W2)}{t2}$$

during the laser non-emitting period of the light source 510 in order to pass through the exposure window area 571 without creating a shadowing stain.

In FIG. 11, the trapezoidal area formed between the horizontal time axis and the three linear segments of the return velocity profile of the corresponding blocking plate represents the total distance traveled by the movable blocking plate from start (v=0) to finish (v=0 again). The cross-hatch shaded area in FIG. 11 represents the minimum distance that the returning block has to travel in order to be completely clear of the exposure window through which it travels before the next flashing of the laser source. When the weighted average Vav of the velocity profile during time duration t2 satisfies the above condition, the blocking plate is guaranteed to have been returned by a distance greater than the minimum total width distance W1+W2 needed to be completely clear of the exposure window area 571. In FIG. 11 that minimum W1+W2 distance is represented as a shaded six-sided polygon that is centered within and does not extend beyond the non-emitting time period t2 of the laser light source 510.

More specifically, in the illustrated example embodiment of FIG. 11, the non-emitting period t2 of the light source 510 is not entirely included in the constant velocity period I2. The blocking plates P5 and P6 travel the minimum distance of W1+W2 so as to be completely clear of the exposure window 571 while being subjected to a positively changing or accelerating velocity (which is in effect to cover first distance d1), while being subjected to a non-changing and thus constant velocity (which covers second distance d2) and while being subjected to a negatively changing or the decelerating velocity (which covers third distance d3). In other words, the sum of a first distance d1 covered when the accelerating velocity is present, of a second distance d2 covered when the constant velocity is present and of a third distance d3 covered when the decelerating velocity is in effect substantially equal to the minimum distance W1+W2 needed to be completely clear of the exposure window 571.

Referring to FIGS. 8D and 11, the quickly returning blocking plates P5 and P6 therefore accelerate in the second moving area A2 during the illustrated acceleration period I1. The quickly returned blocking plates P5 and P6 thereafter decelerate in the first moving area A1 during the illustrated deceleration period I3.

In the return operation according to the present example embodiment, the maximum velocity of the blocking plates P5 and P6 is greater than that of the previous example return operation of FIG. 10, so that the motor 553 should move the blocking plates P5 and P6 faster than that of the previous example embodiment of FIG. 10. Meanwhile, the acceleration/deceleration moving distances (A1+A2) needed by the blocking plates P5 and P6 may be shorter than that of the previous example embodiment of FIG. 10 so that a size of the exposure part 500 may be decreased since the length of each of A1 and A2 can be decreased.

In the present example embodiment, the delay time of the return signal with respect to the laser oscillation start signal Q_TR may have a value different from that of the previous example embodiment of FIG. 10, and an acceleration of the blocking plates P5 and P6 in the acceleration period I1 and the deceleration period I3 may have a value different from that of the previous example embodiment of FIG. 10.

Figure 12:
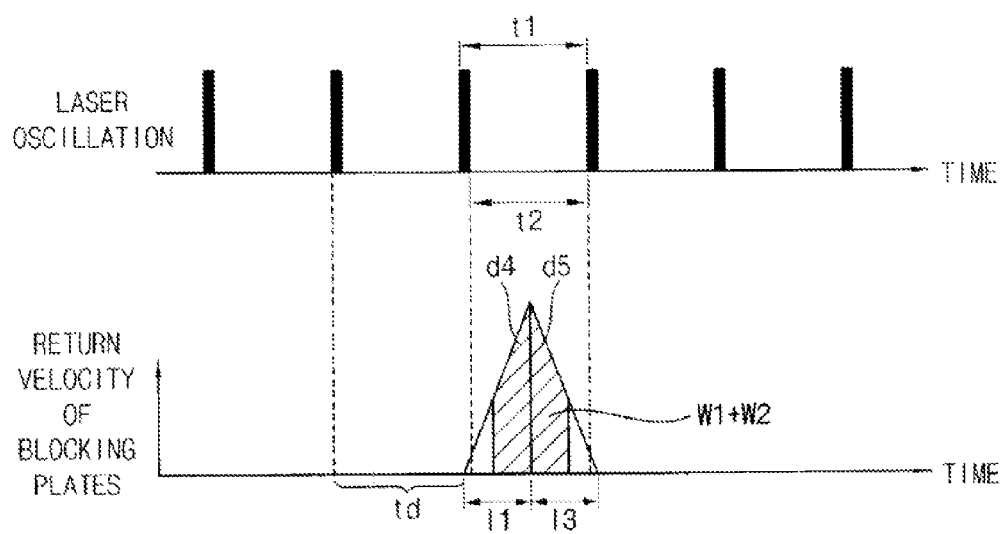
FIG. 12 is a set of timing diagrams to explain a return operation of the blocking plates of FIG. 2 according to still another example embodiment.

FIG. 12 is a set of timing diagrams to explain another return operation of the blocking plates P5 and P6 of FIG. 2 according to still another example embodiment.

The return operation of the blocking plates P5 and P6 according to the example embodiment of FIG. 12 is generally the same as the return operation of the blocking plates P5 and P6 of the previous example embodiment explained referring to FIG. 11 except that the return velocity profile of the blocking plates P5 and P6 essentially has no flat, constant velocity portion at its peak. Thus, the same reference numerals will be used to refer to the same or like parts as those described in the previous example embodiment of FIGS. 1 to 11 and any repetitive explanation concerning the above elements will be omitted.

Referring to FIGS. 2 and 12, an average of the second velocity Vav of the blocking plates P5 and P6 in the exposure window area 571 may satisfy a condition of $$Vav \geq \frac{(W1+W2)}{t2}$$

during the non-emitting period of the light source 510 in order to pass through the exposure window area 571.

In FIG. 12, the distance traveled by the rapidly returning plates P5-P6 during interval t2 includes the shaded area formed between the time axis and the illustrated return velocity profile. Since the distance traveled by the rapidly returning plates P5-P6 during interval t2 is greater than the area represented by the shaded area (d4+d5), the average of the return velocity Vav satisfies the above condition, and the blocking plate is thus returned by a distance greater than the total minimum width W1+W2 needed to completely clear the exposure window 571.

As mentioned, in the present example embodiment, the return operation of the blocking plates essentially does not have a constant velocity period. The blocking plates P5 and P6 pass through the total width W1+W2 of the exposure window 571 and the blocking plate with the accelerating velocity and the decelerating velocity. The sum of a fourth distance d4 with the accelerating velocity and a fifth distance d5 with the decelerating velocity is substantially equal to the total widths W1+W2 needed to fully clear the exposure window area 571.

Referring to FIGS. 4 and 12, the blocking plates P5 and P6 accelerate within the second moving area A2 during the acceleration period I1 and the blocking plates P5 and P6 decelerate within the first moving area A1 during the deceleration period I3.

In the return operation according to the present example, the maximum velocity of the blocking plates P5 and P6 is greater than that of the previous example return operation of FIG. 11, so that the motor 553 should move the blocking plates P5 and P6 faster than that of the previous example embodiment of FIG. 11. Meanwhile, the acceleration/deceleration moving distances (A2, A1) of the blocking plates P5 and P6 may be shorter than that of the previous example embodiment of FIG. 11 so that a size of the exposure part 500 may be decreased.

In the present example embodiment, the delay time of the return signal with respect to the laser oscillation start signal Q_TR may have a value different from that of the previous example embodiment of FIG. 11, and an acceleration of the blocking plates P5 and P6 in the acceleration period I1 and the deceleration period I3 may have a value different from that of the previous example embodiment of FIG. 11.

Figure 13:
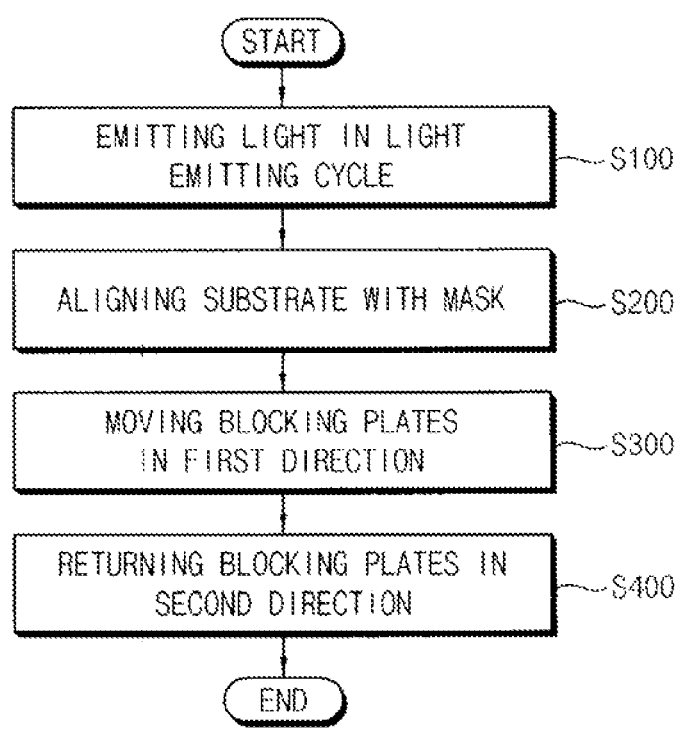
FIG. 13 is a flowchart illustrating a method of driving the exposure apparatus of FIG. 1.

FIG. 13 is a flowchart illustrating a method of driving the exposure apparatus of FIG. 1.

Referring to FIGS. 1 to 3, 7, 8A to 8E and 11, the substrate 2000 is moved from the loading part 100 to the unloading part 700 by passing through the exposure part 500. The substrate 2000 may be moved between the mask 570 and the image processor 590 per FIG. 2.

The light source 510 emits its first flash of laser light at the start of the light emitting cycle t1 (step S100). This light emitting cycle t1 may have a duration of 20 msec for example. The short burst of laser light irradiated from the light source 510 to the substrate 2000 at the start of duration t1 passes through the blind 530 and the mask 570 to form a pattern on unblinded portions the substrate 2000. The pattern may be formed by a process of repeated irradiations with flashes of laser light where t2 is the time between the flashes. For example, the pattern may be designed to be fully formed by use of 24 laser shots per each to-be-developed portion.

The image processor 590 reads a preset pattern formed on the substrate 2000 to correct alignment between the substrate 2000 and the mask 570 (step S200). When the substrate 2000 is a color filter substrate, the preset pattern may include a light blocking pattern formed between the color pixels.

At the start of entry of the mother substrate 2000 into the exposure window 571, the blocking plates P1 to P6 are disposed over the exposure window 571 to block the light to prevent the light from being irradiated to the non-exposed area in the entering substrate 2000.

As the substrate 2000 is moved along the first direction, all of the blocking plates or some of the blocking plates may be moved along the first direction to block the first non-exposed area G1 between the first and second cells C1 and C2 in the substrate 2000 (step S300). The motor control unit 551 may control the blocking plates to be moved in the first direction D1 using the moving signal.

After the mother substrate 2000 has fully entered into the exposure window 571, the blocking plates may have all been moved to just outside of the exposure window 571 in the first direction D1. However, a return of at least some of the blocking plates (e.g., P5-P6) may be required that blocking plates are available for blocking a second non-exposed area G2 that next will be entering the exposure window.

The selected blocking plates are returned in the second direction D2 in order to fully pass through the exposure window area 571 during the non-emitting period t2 of the light source 510 (step S400). The motor control unit 551 may control the blocking plates to be returned in the second direction D2 using the return signal. The return signal may be synchronized with the laser oscillation start signal Q_TR of the light source 510.

All of the blocking plates or some of the blocking plates may be moved along the first direction with the substrate 2000 to block the second non-exposed area G2 between the second and third cells C2 and C3 in the substrate 2000.

The process of moving the blocking plates in the first direction D1 and returning the blocking plates in the second direction D2 explained above may be repeated until the substrate 2000 completely exits the exposure part 500.

According to the present disclosure of invention as explained above, the blocking plates are returned to completely and quickly pass through the exposure window area during the non-emitting period of the light source so that a shadow stain is not formed on the substrate due to the return trips of the blind plates. Accordingly, the display quality of the daughter liquid crystal display panels formed from the so-processed mother substrate 2000 may be improved.

The foregoing is illustrative of the present teachings and is not to be construed as limiting thereof. Although a few example embodiments have been described, those skilled in the art will readily appreciate from the above that many modifications are possible without materially departing from the basic principles of the present teachings. Accordingly, all such modifications are intended to be included within the spirit and scope of the present teachings. It is to be understood that in the claims, means-plus-function clauses are intended to cover the structures described herein as performing the recited function and not only structural equivalents but also functionally equivalent structures. Therefore, it is to be understood that the foregoing is illustrative of the present teachings and is not to be construed as limited to the specific example embodiments disclosed herein, and that modifications to the disclosed example embodiments, as well as other example embodiments, are intended to be included within the scope of the present disclosure.

What is claimed is:

1. An exposure apparatus comprising:
a light source structured to emit a burst of exposure light at the start of a predetermined light emitting cycle having a first period (t1);
a mask retainer disposed to retain a supplied photomask over a supplied substrate where the mask overlaps an exposure window of predetermined first width (W1) and the photomask is able to provide an imaging pattern projected through the exposure window and onto a photoreactive part of the supplied substrate;
a blind including a plurality of movable blocking plates, the blocking plates being respectively movable so as to be disposed over respective and to-be-blocked portions of the exposure window, the movable blocking plates being further movable into first and second area outside opposed sides of the first width (W1) of the exposure window; and
a blind driver including a plurality of motors and a motor control unit, the motors being operatively coupled to move the blocking plates,
wherein the motor control unit is operatively coupled to and thereby synchronized with a start of light burst emission signal of the light source or an equivalent of the start of light burst emission signal so that the motor control unit can identify from the start of light burst emission signal or its equivalent, when a second time period (t2) is taking place wherein no bursts of the exposure light are being emitted from the light source, and
wherein the blind driver is able, in response to a movement control signal provided by the motor control unit, to move at least one of the blocking plates completely through the first width (W1) of the exposure window in a time duration equal to or less than said second time period (t2).

2. The exposure apparatus of claim 1, further comprising a substrate advancing stage structured to move the supplied substrate in a first direction into and through a projection receiving area corresponding to the exposure window.

3. The exposure apparatus of claim 1, further comprising an image processor structured to read a preset pattern formed on the substrate to responsively cause alignment between the substrate and the mask.

4. The exposure apparatus of claim 1,
wherein the blocking plates are movable in opposed first and second directions through a projection blinding area corresponding to the exposure window, and
a first velocity of the blocking plates when moving in the first direction can be made substantially the same as a velocity of the substrate when entering the projection receiving area corresponding to the exposure window.

5. The exposure apparatus of claim 4, wherein
the blocking plates are returnable through the projection blinding area in the second direction which is opposite to the first direction, and
a second velocity of the blocking plates when returned in the second direction can be made substantially greater than the first velocity.

6. The exposure apparatus of claim 5,
wherein the second velocity V of one of the blocking plates when passing through the projection blinding area satisfies a condition of $$V \geq \frac{(W1 + W2)}{\lambda},$$

wherein W1 is the width of the exposure window as measured in the first direction, W2 is a width of the blocking plate as measured in the first direction, and λ is a time period equal to or less than the second time period (t2) wherein no bursts of the exposure light are being emitted from the light source.

7. The exposure apparatus of claim 1, wherein the blocking plates are returned based on a return signal of the motor control unit, and
the return signal is synchronized with the start of light burst emission signal or its equivalent.

8. The exposure apparatus of claim 1, wherein the light source oscillates a laser beam based on excitation light provided from an excitation lamp.

9. The exposure apparatus of claim 8, wherein the start of light burst emission signal or its equivalent corresponds to a laser oscillation start signal that operates to stop emitting the excitation light from the lamp and to start output of a laser beam from the light source.

10. A method of driving an exposure apparatus through which supplied substrates are moved and in which the supplied substrates are exposed to photolithographic exposure light, the method comprising:
emitting a burst of exposure light from a light source during a corresponding light emitting cycle;
moving a plurality of blocking plates in a direction to block a non-exposed area in a supplied substrate but to otherwise expose the substrate, the blocking plates being disposed over the substrate and an exposure window of the apparatus, where at least part of a mask pattern provided by a supplied photomask is formed in the exposure window; and
returning the blocking plates to pass through the exposure window area during a non-emitting period of the light source based on a driving signal synchronized with a light emitting signal of the light source.

11. The method of claim 10, further comprising reading a preset pattern formed on the substrate to align the substrate with the mask.

12. The method of claim 10, wherein the substrate and the blocking plates move in a first direction, and
a first velocity of the blocking plates moving in the first direction is substantially the same as a velocity of the substrate when entering the exposure window.

13. The method of claim 12, wherein the blocking plates are returned in a second direction opposite to the first direction, and
a second velocity of the blocking plates returned in the second direction is greater than the first velocity.

14. The method of claim 13, wherein the second velocity V of the blocking plates passing through the exposure window area satisfies a condition of $$V \geq \frac{(W1 + W2)}{\lambda},$$

wherein W1 is a width of the exposure window in the first direction, W2 is a width of the blocking plate in the first direction, and λ is the light emitting cycle of the light source.

15. The method of claim 14, wherein the blocking plates pass through the exposure window area pursuant to a velocity control profile that includes a constant velocity segment.

16. The method of claim 13, wherein an average of the second velocity Vav of the blocking plates passing through the exposure window area satisfies a condition of $$Vav \geq \frac{(W1 + W2)}{\lambda},$$

wherein W1 is a width of the exposure window in the first direction, W2 is a width of the blocking plate in the first direction, and $\lambda$ is the light emitting cycle of the light source.

17. The method of claim 16, wherein the blocking plates are accelerated and decelerated in the exposure window area when the blocking plates are returned.

18. The method of claim 10, wherein the blocking plates are returned based on a return signal of a motor control unit that controls an operation of motors driving the blocking plates, and the return signal is synchronized with the light emitting signal of the light source.

19. The method of claim 10, wherein the light source outputs a laser beam based on excitation light provided from an excitation lamp.

20. The method of claim 19, wherein the light emitting signal includes a laser oscillation start signal that operates to stop emitting the excitation light from the lamp and to invoke output of the laser beam.

* * * * *